United States Patent
Miyahara

[11] Patent Number: 6,127,670
[45] Date of Patent: Oct. 3, 2000

[54] SOLID-STATE COLOR IMAGE SENSOR HAVING AN ARRANGEMENT TO COMPENSATE FOR DEPENDENCE OF LIGHT SENSING CHARACTERISTICS UPON COLOR

[75] Inventor: Hiroyuki Miyahara, Yokohama, Japan

[73] Assignee: Victor Company of Japan, Ltd., Yokohama, Japan

[21] Appl. No.: 09/095,048

[22] Filed: Jun. 10, 1998

[30] Foreign Application Priority Data

Jun. 30, 1997 [JP] Japan ................................. 9-189218

[51] Int. Cl.$^7$ ................................................. H01L 27/00
[52] U.S. Cl. ...................... 250/208.1; 250/226; 257/435
[58] Field of Search ............................ 250/226, 208.1, 250/216; 257/435, 432, 436

[56] References Cited

U.S. PATENT DOCUMENTS 5,404,005  4/1995  Shimomura et al. ................... 250/226
5,466,926  11/1995  Sasano et al. ........................... 250/216

*Primary Examiner*—Que T. Le
*Attorney, Agent, or Firm*—Louis Woo

[57] ABSTRACT

A solid-state color image sensor includes a two-dimensional array of photo-to-electric conversion areas. A color separation filter has segments opposed to the photo-to-electric conversion areas respectively. The color separation filter segments have respective colors selected from among at least first and second predetermined colors. Micro-lenses operate for focusing portions of incident light containing image information on the photo-to-electric conversion areas via the color separation filter segments, respectively. The micro-lenses related to the color separation filter segments having the first predetermined color are different in characteristic from the micro-lenses related to the color separation filter segments having the second predetermined color. For example, the micro-lenses related to the color separation filter segments having the first predetermined color have a first predetermined curvature, and the micro-lenses related to the color separation filter segments having the second predetermined color have a second predetermined curvature different from the first predetermined curvature.

4 Claims, 7 Drawing Sheets

| W | G | W | G | W | G |
|---|---|---|---|---|---|
| Cy | Ye | Cy | Ye | Cy | Ye |
| W | G | W | G | W | G |
| Ye | Cy | Ye | Cy | Ye | Cy |
| W | G | W | G | W | G |

FIG. 12
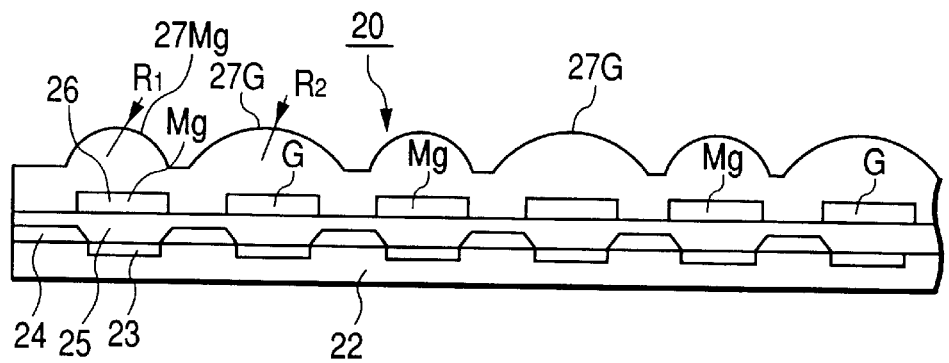
FIG. 13
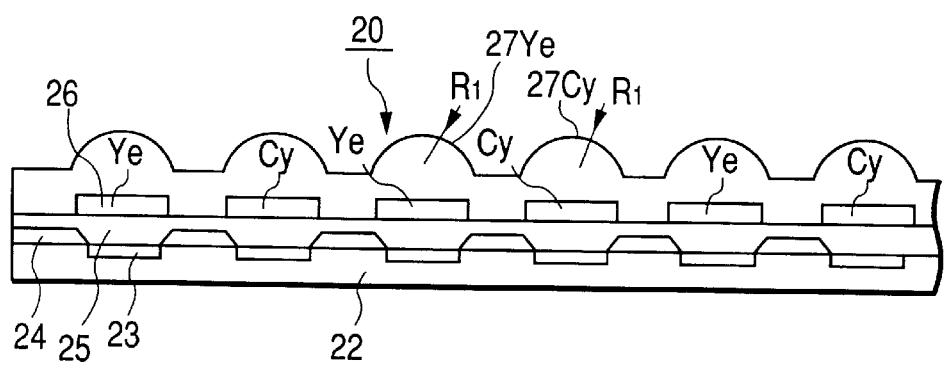
FIG. 14
| Mg | G  | Mg | G  | Mg | G  |
|----|----|----|----|----|----|
| Ye | Cy | Ye | Cy | Ye | Cy |
| Mg | G  | Mg | G  | Mg | G  |
| Cy | Ye | Cy | Ye | Cy | Ye |
| Mg | G  | Mg | G  | Mg | G  |

SOLID-STATE COLOR IMAGE SENSOR HAVING AN ARRANGEMENT TO COMPENSATE FOR DEPENDENCE OF LIGHT SENSING CHARACTERISTICS UPON COLOR

BACKGROUND OF THE INVENTION

1. Field of the Invention

This invention relates to a solid-state color image sensor having a color separation filter.

2. Description of the Related Art

Some color television cameras include solid-state color image sensors with color separation filters. A typical solid-state color image sensor has a two-dimensional array of photosensitive diodes, a checkered color separation filter extending in front of the photosensitive diode array, and a CCD (charge-coupled device) array connected to the photosensitive diode array. The photosensitive diodes form photo-to-electric conversion areas, respectively. The sensitivity of each photo-to-electric conversion area with respect to a corresponding portion of incident light tends to depend on the color of a corresponding segment of the color separation filter. The color-dependent sensitivity of each photo-to-electric conversion area deteriorates a video signal outputted from the image sensor.

SUMMARY OF THE INVENTION

It is an object of this invention to provide an improved solid-state color image sensor.

A first aspect of this invention provides a solid-state color image sensor comprising a two-dimensional array of photo-to-electric conversion areas; a color separation filter having segments opposed to the photo-to-electric conversion areas respectively, the color separation filter segments having respective colors selected from among at least first and second predetermined colors; and micro-lenses for focusing portions of incident light containing image information on the photo-to-electric conversion areas via the color separation filter segments, respectively; wherein the micro-lenses related to the color separation filter segments having the first predetermined color are different in characteristic from the micro-lenses related to the color separation filter segments having the second predetermined color.

A second aspect of this invention is based on the first aspect thereof, and provides a solid-state color image sensor wherein the micro-lenses related to the color separation filter segments having the first predetermined color have a first predetermined curvature, and the micro-lenses related to the color separation filter segments having the second predetermined color have a second predetermined curvature different from the first predetermined curvature.

A third aspect of this invention is based on the first aspect thereof, and provides a solid-state color image sensor wherein the micro-lenses related to the color separation filter segments having the first predetermined color have a first predetermined effective aperture, and the micro-lenses related to the color separation filter segments having the second predetermined color have a second predetermined effective aperture different from the first predetermined effective aperture.

A fourth aspect of this invention provides a solid-state color image sensor comprising a two-dimensional array of photo-to-electric conversion areas; a color separation filter having segments opposed to the photo-to-electric conversion areas respectively, the color separation filter segments having respective colors selected from among at least first and second predetermined colors; and a lens member having micro-lenses and non-lense portions, the micro-lenses being assigned to the color separation filter segments having the first predetermined color, the non-lens portions being assigned to the color separation filter segments having the second predetermined color, the micro-lenses focusing portions of incident light containing image information on the corresponding photo-to-electric conversion areas via the color separation filter segments having the first predetermined color respectively, the non-lens portions conducting portions of the incident light before they reach the corresponding photo-to-electric conversion areas via the color separation filter segments having the second predetermined color respectively.

A fifth aspect of this invention provides a solid-state color image sensor comprising a two-dimensional array of photo-to-electric conversion areas; a color separation filter having segments opposed to the photo-to-electric conversion areas respectively, the color separation filter segments having respective colors selected from among at least first, second, and third predetermined colors; and a lens member having first micro-lenses, second micro-lenses and non-lense portions, the first micro-lenses being assigned to the color separation filter segments having the first predetermined color, the second micro-lenses being assigned to the color separation filter segments having the second predetermined color, the non-lens portions being assigned to the color separation filter segments having the third predetermined color, the first micro-lenses focusing portions of incident light containing image information on the corresponding photo-to-electric conversion areas via the color separation filter segments having the first predetermined color respectively, the second micro-lenses focusing portions of the incident light on the corresponding photo-to-electric conversion areas via the color separation filter segments having the second predetermined color respectively, the non-lens portions conducting portions of the incident light before they reach the corresponding photo-to-electric conversion areas via the color separation filter segments having the third predetermined color respectively; wherein the first micro-lenses are different in characteristic from the second micro-lenses.

A sixth aspect of this invention is based on the fifth aspect thereof, and provides a solid-state color image sensor wherein the first micro-lenses have a first predetermined curvature, and the second micro-lenses have a second predetermined curvature different from the first predetermined curvature.

A seventh aspect of this invention is based on the fifth aspect thereof, and provides a solid-state color image sensor wherein the first micro-lenses have a first predetermined effective aperture, and the second micro-lenses have a second predetermined effective aperture different from the first predetermined effective aperture.

BRIEF DESCRIPTION OF THE DRAWINGS

FIG. 12 is a sectional view of an odd-numbered horizontal line portion of a solid-state color image sensor according to a second embodiment of this invention.

FIG. 13 is a sectional view of an even-numbered horizontal line portion of the solid-state color image sensor according to the second embodiment of this invention.

FIG. 14 is a diagram of a color separation filter in the solid-state color image sensor in FIGS. 12 and 13.

DESCRIPTION OF THE PREFERRED EMBODIMENTS

Prior-art color image sensors will be explained hereinafter for a better understanding of this invention.

Figures 1, 2, 3, 4:
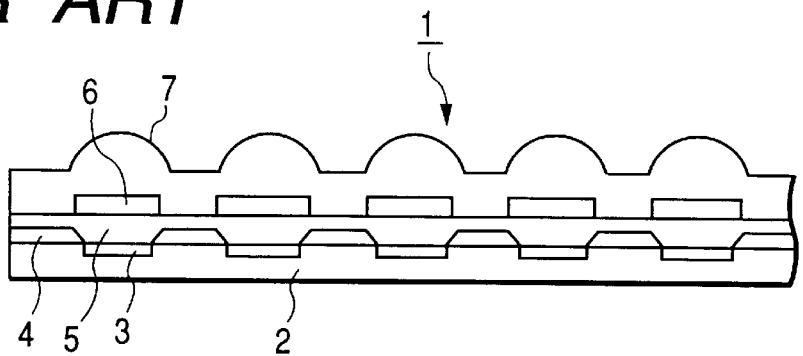
FIG. 1 is a sectional view of a first prior-art color image sensor.
FIG. 2 is a diagram of a color separation filter in the first prior-art color image sensor.
FIG. 3 is a diagram of a color separation filter in a second prior-art color image sensor.
FIG. 4 is a diagram of a color separation filter in a third prior-art color image sensor.

FIG. 1 shows a first prior-art color image sensor 1 of the solid-state type. As shown in FIG. 1, the first prior-art color image sensor 1 includes a semiconductor substrate (a silicon substrate) 2 having an upper surface formed with a two-dimensional array or a matrix array of photo-to-electric conversion areas 3. Each of the photo-to-electric conversion areas 3 includes a photosensitive diode. Each of the photo-to-electric conversion areas 3 corresponds to one pixel.

In the first prior-art color image sensor 1, a light shielding film 4 is formed on a region of the upper surface of the semiconductor substrate 2 which extends between the photo-to-electric conversion areas 3. The light shielding film 4 prevents light from being incident to the upper surface of the semiconductor substrate 2 except the photo-to-electric conversion areas 3.

In the first prior-art color image sensor 1, the photo-to-electric conversion areas 3 and the light shielding film 4 are covered by a transparent film 5 having a flat upper surface. A color separation filter has a two-dimensional array or a matrix array of segments 6 formed on the upper surface of the transparent film 5. The color filter segments 6 have respective colors selected from among a plurality of predetermined colors. The color filter segments 6 extend directly above and align vertically with the photo-to-electric conversion areas 3, respectively. Thus, the color filter segments 6 are opposed to the photo-to-electric conversion areas 3, respectively.

The first prior-art color image sensor 1 includes a two-dimensional array or a matrix array of micro-lenses 7 which extend directly above and align vertically with the color filter segments 6, respectively. The micro-lenses 7 are exposed to respective portions of incident light containing image information. The portions of the incident light successively pass through the micro-lenses 7 and the color filter segments 6 before reaching the photo-to-electric conversion areas 3, respectively. The micro-lenses 7 operate to focus or concentrate the light portions on the photo-to-electric conversion areas 3, respectively.

As shown in FIG. 2, the color filter segments 6 have three colors "R", "G", and "B" which mean red, green, and blue, respectively. The colors of the filter segments 6 are in a predetermined spatially-arranged pattern having a recurrence of equal groups of colors "R", "G", and "B". Specifically, odd-numbered horizontal lines of the color separation filter have colors alternately arranged as "R", "G", "R", "G", "R" . . . . Even-numbered horizontal lines of the color separation filter have colors alternately arranged as "G", "B", "G", "B", "G" . . . .

FIG. 3 shows an arrangement of the colors of segments composing a color separation filter in a second prior-art color image sensor. The second prior-art color image sensor is similar to the first prior-art color image sensor 1 in FIG. 1 except for the color separation filter.

With reference to FIG. 3, in the color separation filter of the second prior-art color image sensor, the filter segments have four colors "W", "G", "Cy", and "Ye" which mean white (transparent), green, cyan, and yellow, respectively. The colors of the filter segments are in a predetermined spatially-arranged pattern having a recurrence of equal groups of colors "W", "G", "Cy", and "Ye". Specifically, odd-numbered horizontal lines of the color separation filter have colors alternately arranged as "W", "G", "W", "G", "W" . . . . First alternate ones of even-numbered horizontal lines of the color separation filter have colors alternately arranged as "Cy", "Ye", "Cy", "Ye", "Cy" . . . . Second alternate ones of even-numbered horizontal lines of the color separation filter have colors alternately arranged as "Ye", "Cy", "Ye", "Cy", "Ye" . . . .

FIG. 4 shows an arrangement of the colors of segments composing a color separation filter in a third prior-art color image sensor. The third prior-art color image sensor is similar to the first prior-art color image sensor 1 in FIG. 1 except for the color separation filter.

With reference to FIG. 4, in the color separation filter of the third prior-art color image sensor, the filter segments have four colors "Mg", "G", "Cy", and "Ye" which mean magenta, green, cyan, and yellow, respectively. The colors of the filter segments are in a predetermined spatially-arranged pattern having a recurrence of equal groups of colors "Mg", "G", "Cy", and "Ye". Specifically, odd-numbered horizontal lines of the color separation filter have colors alternately arranged as "Mg", "G", "Mg", "G", "Mg" . . . . First alternate ones of even-numbered horizontal lines of the color separation filter have colors alternately arranged as "Ye", "Cy", "Ye", "Cy", "Ye" . . . . Second alternate ones of even-numbered horizontal lines of the color separation filter have colors alternately arranged as "Cy", "Ye", "Cy", "Ye", "Cy" . . . .

Figure 5:
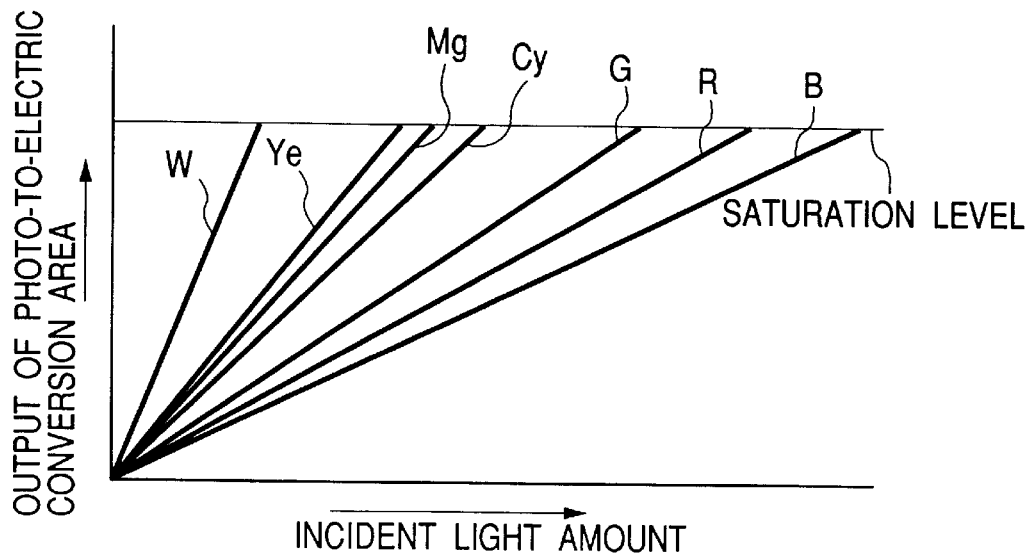
FIG. 5 is a diagram of the relation between the level of an electric signal generated by a photo-to-electric conversion area and the light amount of an incident light portion assigned to the photo-to-electric conversion area for each of white (transparent) "W", yellow "Ye", magenta "Mg", cyan "Cy", green "G", red "R", and blue "B" in the first, second, and third prior-art color image sensors.

In the color separation filters of the first, second, and third prior-art color image sensors, the sensitivity of each photo-to-electric conversion area 3 with respect to a corresponding portion of incident light tends to depend on the color of a corresponding filter segment. As shown in FIG. 5, a photo-to-electric conversion area 3 corresponding to a "W" filter segment, a photo-to-electric conversion area 3 corresponding to a "Ye" filter segment, a photo-to-electric conversion area 3 corresponding to an "Mg" filter segment, a photo-to-electric conversion area 3 corresponding to a "Cy" filter segment, a photo-to-electric conversion area 3 corresponding to a "G" filter segment, a photo-to-electric conversion area 3 corresponding to an "R" filter segment, and a photo-to-electric conversion area 3 corresponding to a "B" filter segment are different in the relation between the level of an electric signal generated thereby and the light amount of an incident light portion assigned thereto. For example, the photo-to-electric conversion area 3 corresponding to the "W" filter segment is saturated easier than the photo-to-electric conversion areas 3 corresponding to the "Ye", "Mg", "Cy", "G", "R", and "B" filter segments.

In the first, second, and third prior-art color image sensors, the color-dependent sensitivities of the color filter segments tend to deteriorate the linearity of luminance and the dynamic range of colors regarding output video signals.

Figure 6:
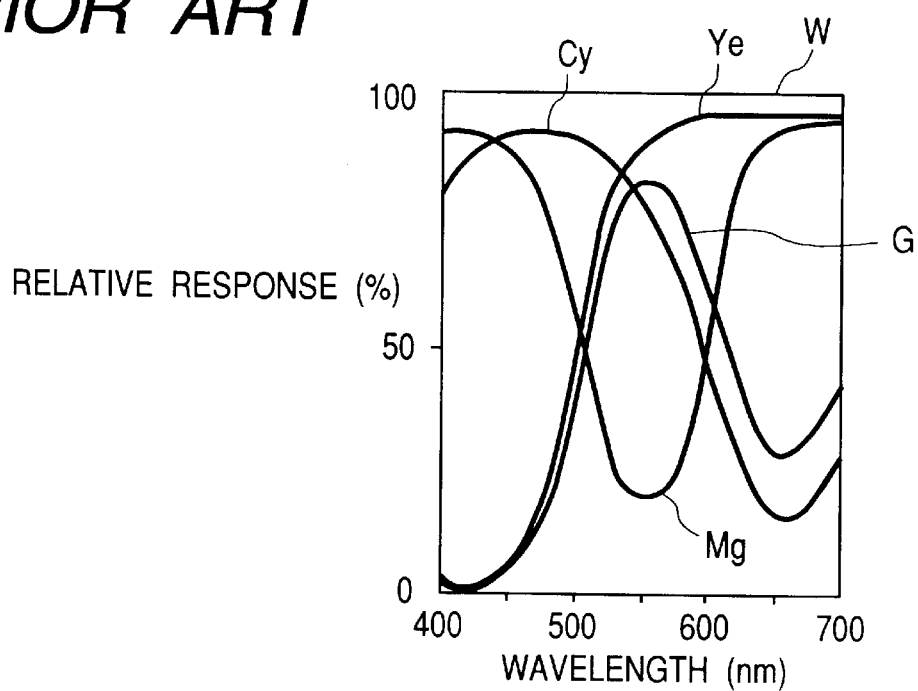
FIG. 6 is a diagram of the relation between the light wavelength and the relative response related to each of "W", "Ye", "Mg", "Cy", and "G" color filter segments in the second and third prior-art color image sensors.

In the color separation filters of the second and third prior-art color image sensors, the filter segments have the following characteristics. With reference to FIG. 6, a filter segment having the color "W", a filter segment having the color "Ye", a filter segment having the color "Mg", a filter segment having a color "Cy", and a filter segment having the color "G" are different in the relation between the relative response and the light wavelength.

Figure 7:
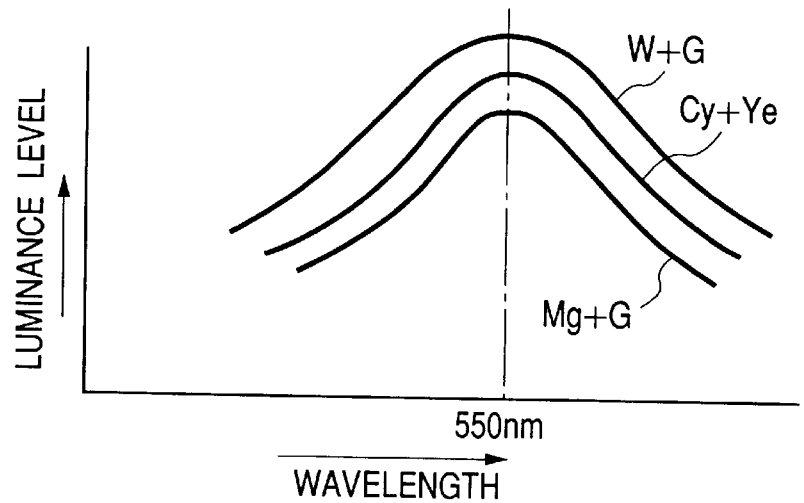
FIG. 7 is a diagram of the relation between the light wavelength and each of the three luminance levels represented by the addition of two color signals in the second and third prior-art color image sensors.

In every odd-numbered horizontal line of the second prior-art color image sensor (see FIG. 3), the electric signals generated by each pair of adjacent "W" and "G" photo-to-electric conversion areas are added and combined into a luminance signal segment. In every even-numbered horizontal line of the second prior-art color image sensor (see FIG. 3), the electric signals generated by each pair of adjacent "Cy" and "Ye" photo-to-electric conversion areas are added and combined into a luminance signal segment. As shown in FIG. 7, the luminance level represented by a luminance signal segment related to "W" and "G" photo-to-electric conversion areas differs from the luminance level represented by a luminance signal segment related to "Cy" and "Ye" photo-to-electric conversion areas. Accordingly, luminance levels in an odd-numbered horizontal line differ from luminance levels in an even-numbered horizontal line. This luminance level difference causes a flicker in images represented by the output video signal of the image sensor in the case where luminance signal segments related to the "W" and "G" photo-to-electric conversion areas compose a luminance signal for an odd-numbered field while luminance signal segments related to the "Cy" and "Ye" photo-to-electric conversion areas compose a luminance signal for an even-numbered field.

In every odd-numbered horizontal line of the third prior-art color image sensor (see FIG. 4), the electric signals generated by each pair of adjacent "Mg" and "G" photo-to-electric conversion areas are added and combined into a luminance signal segment. In every even-numbered horizontal line of the third prior-art color image sensor (see FIG. 4), the electric signals generated by each pair of adjacent "Cy" and "Ye" photo-to-electric conversion areas are added and combined into a luminance signal segment. As shown in FIG. 7, the luminance level represented by a luminance signal segment related to "Mg" and "G" photo-to-electric conversion areas differs from the luminance level represented by a luminance signal segment related to "Cy" and "Ye" photo-to-electric conversion areas. Accordingly, luminance levels in an odd-numbered horizontal line differ from luminance levels in an even-numbered horizontal line. This luminance level difference causes a flicker in images represented by the output video signal of the image sensor in the case where luminance signal segments related to the "Mg" and "G" photo-to-electric conversion areas compose a luminance signal for an odd-numbered field while luminance signal segments related to the "Cy" and "Ye" photo-to-electric conversion areas compose a luminance signal for an even-numbered field.

First Embodiment

Figure 8:
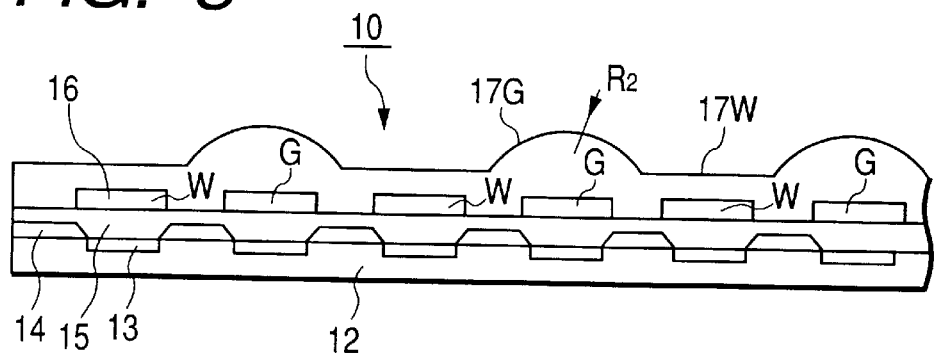
FIG. 8 is a sectional view of an odd-numbered horizontal line portion of a solid-state color image sensor according to a first embodiment of this invention.
Figure 9:
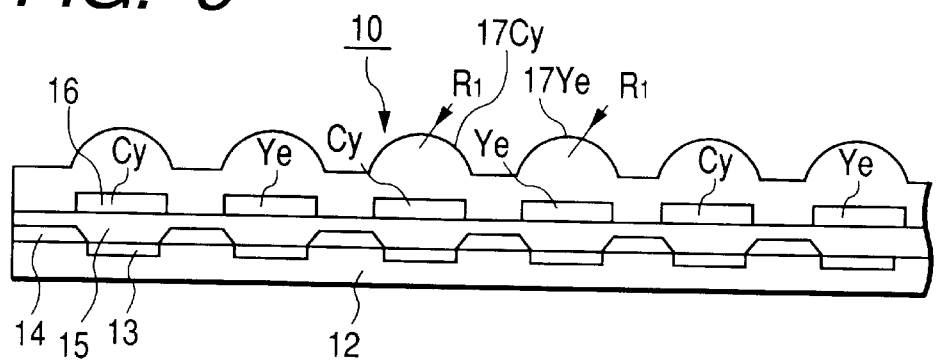
FIG. 9 is a sectional view of an even-numbered horizontal line portion of the solid-state color image sensor according to the first embodiment of this invention.

FIGS. 8 and 9 show a solid-state color image sensor 10 according to a first embodiment of this invention. As shown in FIGS. 8 and 9, the solid-state color image sensor 10 includes a semiconductor substrate (a silicon substrate) 12 having an upper surface formed with a two-dimensional array or a matrix array of photo-to-electric conversion areas 13. Each of the photo-to-electric conversion areas 13 includes a photosensitive diode. Each of the photo-to-electric conversion areas 13 corresponds to one pixel.

A light shielding film 14 is formed on a region of the upper surface of the semiconductor substrate 12 which extends between the photo-to-electric conversion areas 13. The light shielding film 14 prevents light from being incident to the upper surface of the semiconductor substrate 12 except the photo-to-electric conversion areas 13.

The photo-to-electric conversion areas 13 and the light shielding film 14 are covered by a transparent film 15 having a flat upper surface. A color separation filter has a two-dimensional array or a matrix array of segments 16 formed on the upper surface of the transparent film 15. The color filter segments 16 have respective colors selected from among a plurality of predetermined colors. The color filter segments 16 extend directly above and align vertically with the photo-to-electric conversion areas 13, respectively. Thus, the color filter segments 16 are opposed to the photo-to-electric conversion areas 13, respectively.

Figures 10, 11:
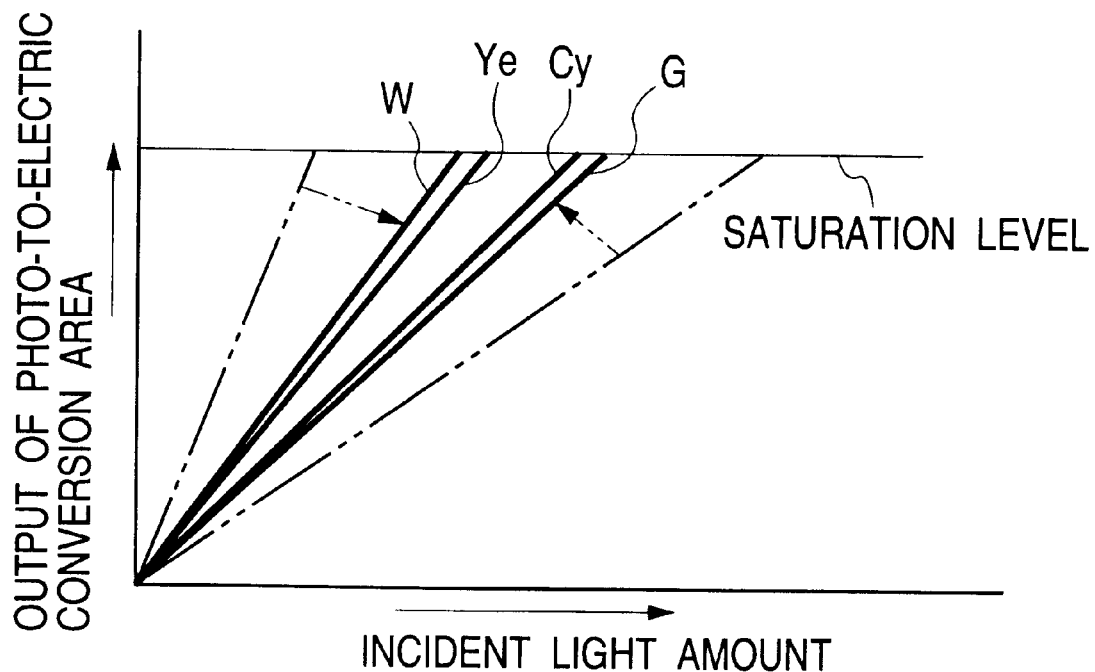
FIG. 10 is a diagram of a color separation filter in the solid-state color image sensor in FIGS. 8 and 9.
FIG. 11 is a diagram of the relation between the level of an electric signal generated by a photo-to-electric conversion area and the light amount of an incident light portion assigned to the photo-to-electric conversion area for each of white (transparent) "W", yellow "Ye", cyan "Cy", and green "G" in the solid-state color image sensor of FIGS. 8 and 9.

As shown in FIG. 10, the color filter segments 16 have four colors "W", "G", "Cy", and "Ye" which mean white (transparent), green, cyan, and yellow, respectively. The colors of the filter segments 16 are in a predetermined spatially-arranged pattern having a recurrence of equal groups of colors "W", "G", "Cy", and "Ye". Specifically, odd-numbered horizontal lines of the color separation filter have colors alternately arranged as "W", "G", "W", "G", "W" . . . . First alternate ones of even-numbered horizontal lines of the color separation filter have colors alternately arranged as "Cy", "Ye", "Cy", "Ye", "Cy" . . . . Second alternate ones of even-numbered horizontal lines of the color separation filter have colors alternately arranged as "Ye", "Cy", "Ye", "Cy", "Ye" . . . .

As shown in FIGS. 8 and 9, upper surfaces of the color filter segments 16 are covered by a lens member having a two-dimensional array or a matrix array of micro-lenses 17G, 17Cy, and 17Ye, and non-lens portions or flat portions 17W. The micro-lenses 17G extend directly above and align vertically with the "G" color filter segments 16, respectively. The micro-lenses 17Cy extend directly above and align vertically with the "Cy" color filter segments 16, respectively. The micro-lenses 17Ye extend directly above and align vertically with the "Ye" color filter segments 16, respectively. The non-lens portions 17W extend directly above and align vertically with the "W" color filter segments 16, respectively.

The micro-lenses 17G, 17Cy, and 17Ye, and the non-lens portions 17W are exposed to respective portions of incident light containing image information. The portions of the incident light pass through the micro-lenses 17G, 17Cy, and 17Ye, and the non-lens portions 17W, and then pass through the color filter segments 16 before reaching the photo-to-electric conversion areas 13, respectively. The micro-lenses 17G, 17Cy, and 17Ye operate to focus or concentrate the related light portions on the "G", "Cy", and "Ye" photo-to-electric conversion areas 13, respectively. The light portions directed toward the "W" color filter segments 16 and the "W" photo-to-electric conversion areas 13 undergo neither a focusing process nor a concentrating process when passing through the non-lens portions 17W.

As shown in FIGS. 8 and 9, the micro-lenses 17G have a predetermined effective aperture which is larger than a predetermined effective aperture of the micro-lenses 17Cy and 17Ye. In other words, the micro-lenses 17G are greater than the micro-lenses 17Cy and 17Ye in area exposed to incident light containing image information. Accordingly, the micro-lenses 17G have higher light focusing and collecting performances than those of the micro-lenses 17Cy and 17Ye. As shown in FIG. 8, the micro-lenses 17G have a predetermined radius R2 of curvature. As shown in FIG. 9, the micro-lenses 17Cy and 17Ye have a predetermined radius R1 of curvature. It is preferable that the predetermined radius R1 is larger than the predetermined radius R2. In this case, the curvature "1/R2" of the micro-lenses 17G is larger than the curvature "1/R1" of the micro-lenses 17Cy and 17Ye. The predetermined radius R1 may be smaller than the predetermined radius R2. In this case, the curvature "1/R2" of the micro-lenses 17G is smaller than the curvature "1/R1" of the micro-lenses 17Cy and 17Ye.

FIG. 11 shows the relation between the light amount of an incident light portion assigned to a "W" photo-to-electric conversion area 13 and the level of an electric signal generated by the "W" photo-to-electric conversion area 13. FIG. 11 also shows corresponding relations regarding "Ye", "Cy", and "G" photo-to-electric conversion areas 13. The "W", "Ye", "Cy", and "G" relations shown in FIG. 11 are close to each other. A non-lens portion 17W causes the "W" relation to be close to the "Ye", "Cy", and "G" relations in FIG. 11. The high light focusing and collecting performances of a micro-lens 17G cause the "G" relation to be close to the "W", "Ye", and "Cy" relations in FIG. 11.

In every odd-numbered horizontal line of the solid-state color image sensor 10, the electric signals generated by each pair of adjacent "W" and "G" photo-to-electric conversion areas 13 are added and combined into a luminance signal segment. In every even-numbered horizontal line of the solid-state color image sensor 10, the electric signals generated by each pair of adjacent "Cy" and "Ye" photo-to-electric conversion areas 13 are added and combined into a luminance signal segment. Since the "W", "Ye", "Cy", and "G" relations shown in FIG. 11 are close to each other, the luminance level represented by a luminance signal segment related to "W" and "G" photo-to-electric conversion areas 13 is approximately or substantially equal to the luminance level represented by a luminance signal segment related to "Cy" and "Ye" photo-to-electric conversion areas 13. Accordingly, luminance levels in an odd-numbered horizontal line are approximately or substantially equal to luminance levels in an even-numbered horizontal line. This luminance level equality prevents the occurrence of a flicker in images represented by the output video signal of the solid-state color image sensor 10 in the case where luminance signal segments related to the "W" and "G" photo-to-electric conversion areas 13 compose a luminance signal for an odd-numbered field while luminance signal segments related to the "Cy" and "Ye" photo-to-electric conversion areas 13 compose a luminance signal for an even-numbered field.

It is understood from FIG. 6 that as a color temperature drops, the level of a "Ye" electric signal increases while the level of a "Cy" electric signal decreases. Thus, the level of the sum (the addition) of the "Cy" electric signal and the "Ye" electric signal is substantially independent of the color temperature. As understood from FIG. 6, the relative response related to a "G" color filter segment does not have any peak in a high color temperature side and a low color temperature side. In addition, the relative response related to a "W" color filter segment is independent of the color temperature. Thus, the level of the sum (the addition) of a "G" electric signal and a "W" electric signal is substantially independent of the color temperature. Accordingly, a change in the color temperature is prevented from adversely affecting luminance components of the output video signal of the solid-state color image sensor 10.

It should be noted that the curvature of the micro-lenses 17Cy may differ from the curvature of the micro-lenses 17Ye.

Second Embodiment

FIGS. 12 and 13 show a solid-state color image sensor 20 according to a second embodiment of this invention. As shown in FIGS. 12 and 13, the solid-state color image sensor 20 includes a semiconductor substrate (a silicon substrate) 22 having an upper surface formed with a two-dimensional array or a matrix array of photo-to-electric conversion areas 23. Each of the photo-to-electric conversion areas 23 includes a photosensitive diode. Each of the photo-to-electric conversion areas 23 corresponds to one pixel.

A light shielding film 24 is formed on a region of the upper surface of the semiconductor substrate 22 which extends between the photo-to-electric conversion areas 23. The light shielding film 24 prevents light from being incident to the upper surface of the semiconductor substrate 22 except the photo-to-electric conversion areas 23.

The photo-to-electric conversion areas 23 and the light shielding film 24 are covered by a transparent film 25 having a flat upper surface. A color separation filter has a two-dimensional array or a matrix array of segments 26 formed on the upper surface of the transparent film 25. The color filter segments 26 have respective colors selected from among a plurality of predetermined colors. The color filter segments 26 extend directly above and align vertically with the photo-to-electric conversion areas 23, respectively. Thus, the color filter segments 26 are opposed to the photo-to-electric conversion areas 23, respectively.

As shown in FIG. 14, the color filter segments 26 have four colors "Mg", "G", "Cy", and "Ye" which mean magenta, green, cyan, and yellow, respectively. The colors of the filter segments 26 are in a predetermined spatially-arranged pattern having a recurrence of equal groups of colors "Mg", "G", "Cy", and "Ye". Specifically, odd-numbered horizontal lines of the color separation filter have colors alternately arranged as "Mg", "G", "Mg", "G", "Mg". First alternate ones of even-numbered horizontal lines of the color separation filter have colors alternately arranged as "Ye", "Cy", "Ye", "Cy", "Ye" . . . . Second alternate ones of even-numbered horizontal lines of the color separation filter have colors alternately arranged as "Cy", "Ye", "Cy", "Ye", "Cy" . . . .

As shown in FIGS. 12 and 13, upper surfaces of the color filter segments 26 are covered by a lens member having a two-dimensional array or a matrix array of micro-lenses 27Mg, 27G, 27Cy, and 27Ye. The micro-lenses 27Mg extend directly above and align vertically with the "Mg" color filter segments 26, respectively.

The micro-lenses 27G extend directly above and align vertically with the "G" color filter segments 26, respectively. The micro-lenses 27Cy extend directly above and align vertically with the "Cy" color filter segments 26, respectively. The micro-lenses 27Ye extend directly above and align vertically with the "Ye" color filter segments 26, respectively.

The micro-lenses 27Mg, 27G, 27Cy, and 27Ye are exposed to respective portions of incident light containing image information. The portions of the incident light successively pass through the micro-lenses 27Mg, 27G, 27Cy, and 27Ye and the color filter segments 26 before reaching the photo-to-electric conversion areas 23, respectively. The micro-lenses 27Mg, 27G, 27Cy, and 27Ye operate to focus or concentrate the related light portions on the "Mg", "G", "Cy", and "Ye" photo-to-electric conversion areas 23, respectively.

As shown in FIGS. 12 and 13, the micro-lenses 27G have a predetermined effective aperture which is larger than a predetermined effective aperture of the micro-lenses 27Mg, 27Cy, and 27Ye. In other words, the micro-lenses 27G are greater than the micro-lenses 27Mg, 27Cy, and 27Ye in area exposed to incident light containing image information. Accordingly, the micro-lenses 27G have higher light focusing and collecting performances than those of the micro-lenses 27Mg, 27Cy, and 27Ye. As shown in FIG. 12, the micro-lenses 27G have a predetermined radius R2 of curvature. As shown in FIGS. 12 and 13, the micro-lenses 27Mg, 27Cy, and 27Ye have a predetermined radius R1 of curvature. It is preferable that the predetermined radius R1 is larger than the predetermined radius R2. In this case, the curvature "1/R2" of the micro-lenses 27G is larger than the curvature "1/R1" of the micro-lenses 27Mg, 27Cy, and 27Ye. The predetermined radius R1 may be smaller than the predetermined radius R2. In this case, the curvature "1/R2" of the micro-lenses 27G is smaller than the curvature "1/R1" of the micro-lenses 27Mg, 27Cy, and 27Ye.

Figure 15:
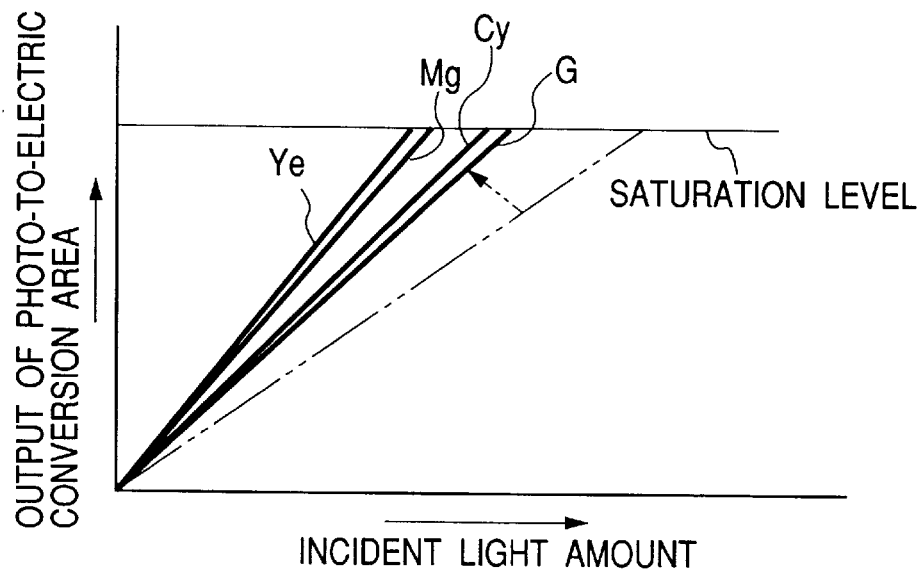
FIG. 15 is a diagram of the relation between the level of an electric signal generated by a photo-to-electric conversion area and the light amount of an incident light portion assigned to the photo-to-electric conversion area for each of magenta "Mg", yellow "Ye", cyan "Cy", and green "G" in the solid-state color image sensor of FIGS. 12 and 13.

FIG. 15 shows the relation between the light amount of an incident light portion assigned to an "Mg" photo-to-electric conversion area 23 and the level of an electric signal generated by the "Mg" photo-to-electric conversion area 23. FIG. 15 also shows corresponding relations regarding "Ye", "Cy", and "G" photo-to-electric conversion areas 23. The "Mg", "Ye", "Cy", and "G" relations shown in FIG. 15 are close to each other. The high light focusing and collecting performances of a micro-lens 27G cause the "G" relation to be close to the "Mg", "Ye", and "Cy" relations in FIG. 15.

In every odd-numbered horizontal line of the solid-state color image sensor 20, the electric signals generated by each pair of adjacent "Mg" and "G" photo-to-electric conversion areas 23 are added and combined into a luminance signal segment. In every even-numbered horizontal line of the solid-state color image sensor 20, the electric signals generated by each pair of adjacent "Cy" and "Ye" photo-to-electric conversion areas 23 are added and combined into a luminance signal segment. Since the "Mg", "Ye", "Cy", and "G" relations shown in FIG. 15 are close to each other, the luminance level represented by a luminance signal segment related to "Mg" and "G" photo-to-electric conversion areas 23 is approximately or substantially equal to the luminance level represented by a luminance signal segment related to "Cy" and "Ye" photo-to-electric conversion areas 23. Accordingly, luminance levels in an odd-numbered horizontal line are approximately or substantially equal to luminance levels in an even-numbered horizontal line. This luminance level equality prevents the occurrence of a flicker in images represented by the output video signal of the solid-state color image sensor 20 in the case where luminance signal segments related to the "Mg" and "G" photo-to-electric conversion areas 23 compose a luminance signal for an odd-numbered field while luminance signal segments related to the "Cy" and "Ye" photo-to-electric conversion areas 23 compose a luminance signal for an even-numbered field.

It is understood from FIG. 6 that as a color temperature drops, the level of a "Ye" electric signal increases while the level of a "Cy" electric signal decreases. Thus, the level of the sum (the addition) of the "Cy" electric signal and the "Ye" electric signal is substantially independent of the color temperature. As understood from FIG. 6, the relative response related to a "G" color filter segment does not have any peak in a high color temperature side and a low color temperature side. In addition, the relative response related to an "Mg" color filter segment in a high color temperature side is approximately equal to that in a low color temperature side. Thus, the level of the sum (the addition) of a "G" electric signal and an "Mg" electric signal is substantially independent of the color temperature. Accordingly, a change in the color temperature is prevented from adversely affecting luminance components of the output video signal of the solid-state color image sensor 20.

It should be noted that the curvature of the micro-lenses 27Mg, the curvature of the micro-lenses 27Cy, and the curvature of the micro-lenses 27Ye may differ from each other.

Third Embodiment

Figure 16:
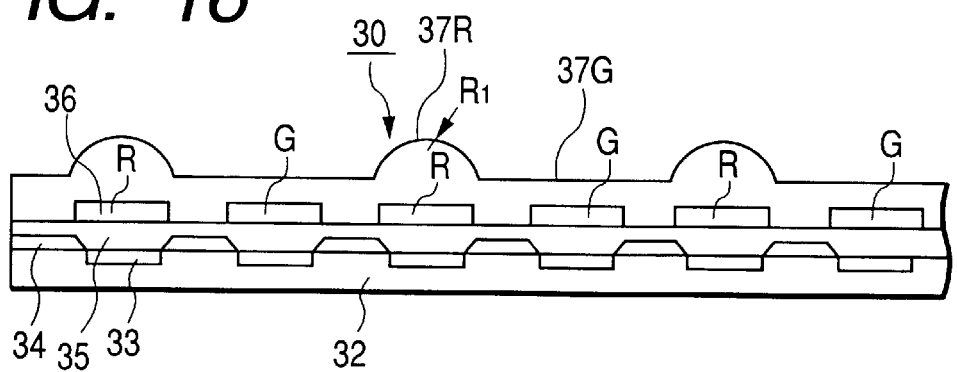
FIG. 16 is a sectional view of an odd-numbered horizontal line portion of a solid-state color image sensor according to a third embodiment of this invention.
Figure 17:
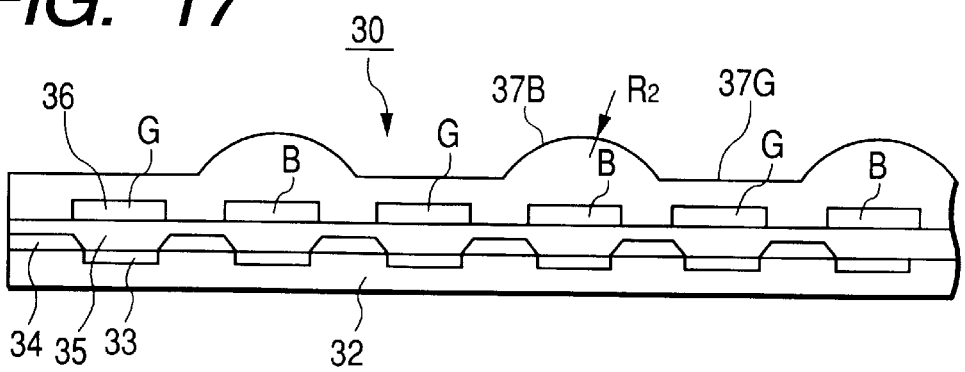
FIG. 17 is a sectional view of an even-numbered horizontal line portion of the solid-state color image sensor according to the third embodiment of this invention.

FIGS. 16 and 17 show a solid-state color image sensor 30 according to a third embodiment of this invention. As shown in FIGS. 16 and 17, the solid-state color image sensor 30 includes a semiconductor substrate (a silicon substrate) 32 having an upper surface formed with a two-dimensional array or a matrix array of photo-to-electric conversion areas 33. Each of the photo-to-electric conversion areas 33 includes a photosensitive diode. Each of the photo-to-electric conversion areas 33 corresponds to one pixel.

A light shielding film 34 is formed on a region of the upper surface of the semiconductor substrate 32 which extends between the photo-to-electric conversion areas 33. The light shielding film 34 prevents light from being incident to the upper surface of the semiconductor substrate 32 except the photo-to-electric conversion areas 33.

The photo-to-electric conversion areas 33 and the light shielding film 34 are covered by a transparent film 35 having a flat upper surface. A color separation filter has a two-dimensional array or a matrix array of segments 36 formed on the upper surface of the transparent film 35. The color filter segments 36 have respective colors selected from among a plurality of predetermined colors. The color filter segments 36 extend directly above and align vertically with the photo-to-electric conversion areas 33, respectively. Thus, the color filter segments 36 are opposed to the photo-to-electric conversion areas 33, respectively.

Figures 18, 19:
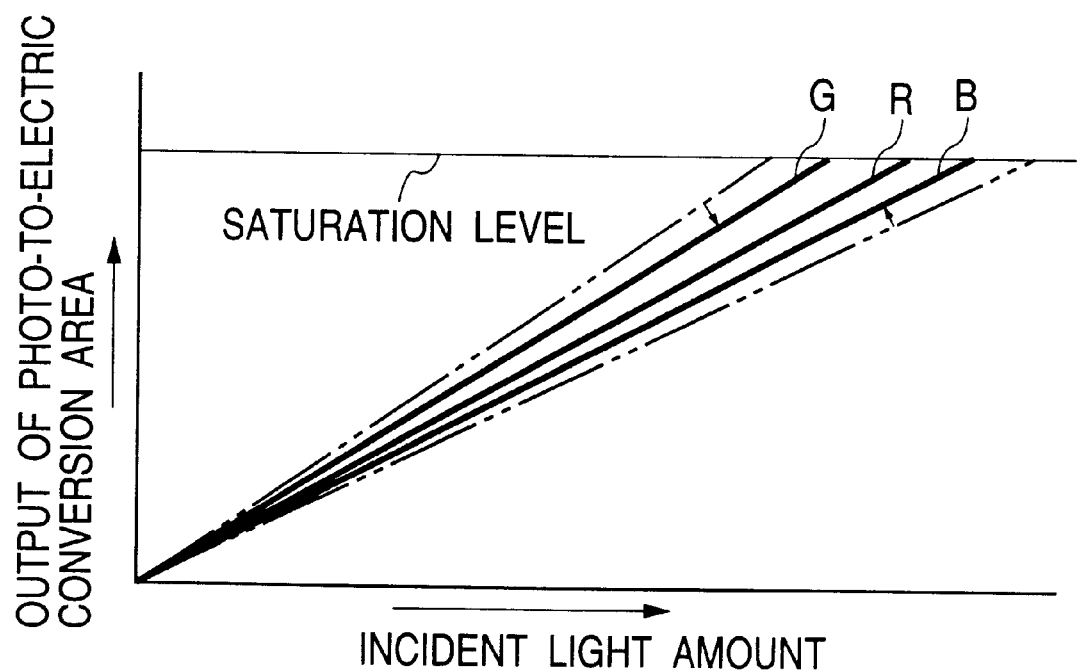
FIG. 18 is a diagram of a color separation filter in the solid-state color image sensor in FIGS. 16 and 17.
FIG. 19 is a diagram of the relation between the level of an electric signal generated by a photo-to-electric conversion area and the light amount of an incident light portion assigned to the photo-to-electric conversion area for each of red "R", green "G", and blue "B" in the solid-state color image sensor of FIGS. 16 and 17.

As shown in FIG. 18, the color filter segments 36 have three colors "R", "G", and "B" which mean red, green, and blue, respectively. The colors of the filter segments 36 are in a predetermined spatially-arranged pattern having a recurrence of equal groups of colors "R", "G", and "B". Specifically, odd-numbered horizontal lines of the color separation filter have colors alternately arranged as "R", "G", "R", "G", "R" . . . . Even-numbered horizontal lines of the color separation filter have colors alternately arranged as "G", "B", "G", "B", "G" . . . .

As shown in FIGS. 16 and 17, upper surfaces of the color filter segments 36 are covered by a lens member having a two-dimensional array or a matrix array of micro-lenses 37R and 37B, and non-lens portions or flat portions 37G. The micro-lenses 37R extend directly above and align vertically with the "R" color filter segments 36, respectively. The micro-lenses 37B extend directly above and align vertically with the "B" color filter segments 36, respectively. The non-lens portions 37G extend directly above and align vertically with the "G" color filter segments 36, respectively.

The micro-lenses 37R and 37B, and the non-lens portions 37G are exposed to respective portions of incident light containing image information. The portions of the incident light pass through the micro-lenses 37R and 37B, and the non-lens portions 37G, and then pass through the color filter segments 36 before reaching the photo-to-electric conversion areas 33, respectively. The micro-lenses 37R and 37B operate to focus or concentrate the related light portions on the "R" and "B" photo-to-electric conversion areas 33, respectively. The light portions directed toward the "G" color filter segments 36 and the "G" photo-to-electric conversion areas 33 undergo neither a focusing process nor a concentrating process when passing through the non-lens portions 37G.

As shown in FIGS. 16 and 17, the micro-lenses 37B have a predetermined effective aperture which is larger than a predetermined effective aperture of the micro-lenses 37R. In other words, the micro-lenses 37B are greater than the micro-lenses 37R in area exposed to incident light containing image information. Accordingly, the micro-lenses 37B have higher light focusing and collecting performances than those of the micro-lenses 37R. As shown in FIG. 17, the micro-lenses 37B have a predetermined radius R2 of curvature. As shown in FIG. 16, the micro-lenses 37R have a predetermined radius R1 of curvature. It is preferable that the predetermined radius R1 is larger than the predetermined radius R2. In this case, the curvature "1/R2" of the micro-lenses 37B is greater than the curvature "1/R1" of the micro-lenses 37R. The predetermined radius R1 may be smaller than the predetermined radius R2. In this case, the curvature "1/R2" of the micro-lenses 37B is smaller than the curvature "1/R1" of the micro-lenses 37R.

FIG. 19 shows the relation between the light amount of an incident light portion assigned to a "G" photo-to-electric conversion area 33 and the level of an electric signal generated by the "G" photo-to-electric conversion area 33. FIG. 19 also shows corresponding relations regarding "R" and "B" photo-to-electric conversion areas 33. The "R", "G", and "B" relations shown in FIG. 19 are close to each other. A non-lens portion 37G causes the "G" relation to be close to the "R" and "B" relations in FIG. 19. The high light focusing and collecting performances of a micro-lens 37B cause the "B" relation to be close to the "R" and "G" relations in FIG. 19.

In every odd-numbered horizontal line of the solid-state color image sensor 30, the electric signals generated by each pair of adjacent "R" and "G" photo-to-electric conversion areas 33 are added and combined into a luminance signal segment. In every even-numbered horizontal line of the solid-state color image sensor 30, the electric signals generated by each pair of adjacent "G" and "B" photo-to-electric conversion areas 33 are added and combined into a luminance signal segment. Since the "R", "G", and "B" relations shown in FIG. 19 are close to each other, the luminance level represented by a luminance signal segment related to "R" and "G" photo-to-electric conversion areas 33 is approximately or substantially equal to the luminance level represented by a luminance signal segment related to "G" and "B" photo-to-electric conversion areas 33. Accordingly, luminance levels in an odd-numbered horizontal line are approximately or substantially equal to luminance levels in an even-numbered horizontal line. This luminance level equality prevents the occurrence of a flicker in images represented by the output video signal of the solid-state color image sensor 30 in the case where luminance signal segments related to the "R" and "G" photo-to-electric conversion areas 33 compose a luminance signal for an odd-numbered field while luminance signal segments related to the "G" and "B" photo-to-electric conversion areas 33 compose a luminance signal for an even-numbered field.

What is claimed is:

1. A solid-state color image sensor comprising:
   a two-dimensional array of photo-to-electric conversion areas;
   a color separation filter having segments opposed to the photo-to-electric conversion areas respectively, the color separation filter segments having respective colors selected from among at least first and second predetermined colors, the color separation filter segments being spaced from each other; and
   means for compensating for dependence of sensitivities of the photo-to-electric conversion areas upon color, the means including a lens member having micro-lenses and non-lense portions, the micro-lenses being assigned to the color separation filter segments having the first predetermined color, the non-lens portions being assigned to the color separation filter segments having the second predetermined color, the micro-lenses focusing portions of incident light containing image information on the corresponding photo-to-electric conversion areas via the color separation filter segments having the first predetermined color respectively, the non-lens portions conducting portions of the Incident light before they reach the corresponding photo-to-electric conversion areas via the color separation filter segments having the second predetermined color respectively.

2. A solid-state color image sensor comprising;

a two-dimensional array of photo-to-electric conversion areas;

a color separation filter having segments opposed to the photo-to-electric conversion areas respectively, the color separation filter segments having respective colors selected from among at least first, second, and third predetermined colors, the color separation filter segments being spaced from each other; and means for compensating for dependence of sensitivities of the photo-to-electric conversion areas upon color, the means including a lens member having first micro-lenses, second micro-lenses and non-lense portions, the first micro-lenses being assigned to the color separation filter segments having the first predetermined color, the second micro-lenses being assigned to the color separation filter segments having the second predetermined color, the non-lens portions being assigned to the color separation filter segments having the third predetermined color, the first micro-lenses focusing portions of incident light containing image information on the corresponding photo-to-electric conversion areas via the color separation filter segments having the first predetermined color respectively, the second micro-lenses focusing portions of the incident light on the corresponding photo-to-electric conversion areas via the color separation filter segments having the second predetermined color respectively, the non-lens portions conducting portions of the incident light before they reach the corresponding photo-to-electric conversion areas via the color separation filter segments having the third predetermined color respectively;

wherein the first micro-lenses are different in characteristic from the second micro-lenses.

3. A solid-state color image sensor as recited in claim 2, wherein the first micro-lenses have a first predetermined effective, aperture, and the second micro-lenses have a second predetermined effective aperture different from the first predetermined effective aperture.

4. A solid-state color image sensor as recited in claim 2, wherein the first micro-lenses have a first predetermined curvature, and the second micro-lenses have a second predetermined curvature different from the first predetermined curvature.

* * * * *